US012620939B2

(12) United States Patent
Sapia et al.

(10) Patent No.: US 12,620,939 B2
(45) Date of Patent: May 5, 2026

(54) MAGNETIC FIELD CANCELLATION IN RADIO FREQUENCY POWER AMPLIFIER ENVELOPE TRACKERS

(71) Applicant: Analog Devices International Unlimited Company, County Limerick (IE)

(72) Inventors: Gary A. Sapia, Soquel, CA (US); Andrew J. Gardner, Santa Barbara, CA (US); Marcello Criscione, London (GB)

(73) Assignee: Analog Devices International Unlimited Company, County Limerick (IE)

( * ) Notice: Subject to any disclaimer, the term of this patent is extended or adjusted under 35 U.S.C. 154(b) by 77 days.

(21) Appl. No.: 18/677,631

(22) Filed: May 29, 2024

(65) Prior Publication Data

US 2024/0405725 A1    Dec. 5, 2024

Related U.S. Application Data

(60) Provisional application No. 63/505,009, filed on May 30, 2023.

(51) Int. Cl.
| | |
|---|---|
| *H03F 3/24* | (2006.01) |
| *H03F 1/02* | (2006.01) |
| *H04B 1/16* | (2006.01) |

(52) U.S. Cl.
CPC ........... *H03F 1/0233* (2013.01); *H03F 3/245* (2013.01); *H04B 1/1607* (2013.01); *H03F 2200/105* (2013.01); *H03F 2200/451* (2013.01)

(58) Field of Classification Search
CPC . G05F 1/10; H01L 27/02; H01L 27/06; H03F 1/02; H03F 1/0233; H03F 3/21;
(Continued)

(56) References Cited

U.S. PATENT DOCUMENTS

| | | | |
|---|---|---|---|
| 8,823,345 | B2 | 9/2014 | Shtargot et al. |
| 10,686,407 | B2 | 6/2020 | Nomiyama et al. |
| | | (Continued) | |

FOREIGN PATENT DOCUMENTS

| | | |
|---|---|---|
| EP | 3 565 115 A1 | 11/2019 |
| WO | WO 2023/054369 A1 | 4/2023 |
| WO | WO 2023/054384 A1 | 4/2023 |

OTHER PUBLICATIONS

Extended European Search Report issued in European Patent Application No. 24176902.5, dated Oct. 11, 2024.
(Continued)

*Primary Examiner* — Shawkat M Ali
(74) *Attorney, Agent, or Firm* — Knobbe, Martens, Olson & Bear, LLP

(57) ABSTRACT

Aspects of this disclosure relate to generating a bias signal with magnetic field cancellation. A voltage modulator circuit can generate a bias voltage that tracks an envelope of a radio frequency signal. For example, the bias signal can track the envelope of the radio frequency signal that is amplified by a power amplifier on a symbol-by-symbol basis. The voltage modulator circuit includes one or more pairs of switches with magnetic field cancellation.

20 Claims, 17 Drawing Sheets

(58) Field of Classification Search
CPC ... H03F 3/24; H03F 3/72; H03F 3/195; H03F
3/245; H03K 5/14; H03K 17/16; H04B
1/04; H04B 1/16; H04B 1/38; H04B
1/1607
USPC .......... 323/282; 330/127; 375/219, 295–297,
375/316
See application file for complete search history.

(56) References Cited

U.S. PATENT DOCUMENTS

| | | | |
|---|---|---|---|
| 11,569,783 B2 | 1/2023 | Nomiyama et al. | |
| 2007/0010218 A1* | 1/2007 | Monroe | H03F 3/24 |
| | | | 330/261 |
| 2014/0111174 A1 | 4/2014 | Shtargot et al. | |
| 2020/0161253 A1 | 5/2020 | Shtargot et al. | |
| 2020/0253039 A1 | 8/2020 | Hashiguchi et al. | |
| 2021/0384875 A1* | 12/2021 | Lyalin | H03F 1/3247 |
| 2022/0407466 A1 | 12/2022 | Zou et al. | |
| 2023/0361731 A1 | 11/2023 | Huang et al. | |
| 2024/0235484 A1 | 7/2024 | Kogure et al. | |

OTHER PUBLICATIONS

Gao, "Average Power Tracking Power Amplifier with Multilevel Supply Voltage for Wi-Fi Applications" IEEE Xplore, 2020, in 6 pages.
Iversen, et al., "Multilevel tracking power supply for switch-mode audio power amplifiers," Proceedings of Applied Power Electronics Conference and Exposition, 2018.
Triano, Application Report: Basics of Power MUX, Texas Instruments, Revised Oct. 2020, in 13 pages.
"Bias tee", Wikipedia, last edited Sep. 7, 2024, retrieved online: https://en.wikipedia.org/wiki/Bias_tee [accessed on Aug. 27, 2025].
Capello, T., "Design and Characterization of Power Converters and Amplifiers for Supply-Modulation based Transmitter Architectures," Dissertation Thesis, Alma Mater Studiorum—Universita di Bologna, 2017, in 216 pages.
Office Action issued in Korean Patent Application No. 10-2024-0066356, dated Jul. 30, 2025.
"Quarter-wave Tricks", Microwaves101.com, copyrighted 2025, retrieved online: https://www.microwaves101.com/encyclopedias/quarter-wave-tricks [accessed on Aug. 27, 2025].

* cited by examiner

MAGNETIC FIELD CANCELLATION IN RADIO FREQUENCY POWER AMPLIFIER ENVELOPE TRACKERS

CROSS REFERENCE TO PRIORITY APPLICATION

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/505,009, filed May 30, 2023 and titled "MAGNETIC FIELD CANCELLATION IN RADIO FREQUENCY POWER AMPLIFIER ENVELOPE TRACKERS," the disclosure of which is hereby incorporated by reference in its entirety and for all purposes.

BACKGROUND

Technical Field

Embodiments of this disclosure relate to generating a bias voltage for a power amplifier, where the bias voltage tracks an envelope of a radio frequency signal.

Description of Related Technology

Radio systems can transmit and receive signals in the form of electromagnetic waves having a frequency in range from approximately 30 kilohertz (kHz) to 300 Gigahertz (GHz). Radio systems can be used for wireless communications, such as cellular communications and/or other wireless network communications.

Radio systems that transmit signals often include a power amplifier to amplify a radio frequency signal for transmission via one or more antennas. Power amplifiers can consume significant power in such systems. Power efficient power amplifiers can be desirable for a variety of applications.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a power amplifier system with magnetic field cancellation in envelope tracking. The power amplifier system includes a voltage modulator circuit and a power amplifier. The voltage modulator circuit is configured to generate a bias voltage that tracks an envelope of a radio frequency signal. The voltage modulator circuit includes a pair of switches with magnetic field cancellation. The power amplifier is configured to receive the bias voltage and amplify the radio frequency signal.

The pair of switches can include a first switch and a second switch. The first switch can be in a first current loop that also includes a first bypass capacitor, the second switch can be in a second current loop that also includes a second bypass capacitor, and the first current loop and the second current loop can generate magnetic fields having opposite directions. The voltage modulator circuit can include a second pair of switches with magnetic field cancellation, the pair of switches can receive a first supply voltage, and the second pair of switches can receive a second supply voltage. The bias voltage can track the envelope of the radio frequency signal on a symbol-by-symbol basis. The voltage modulator circuit can adjust the bias voltage corresponding to symbol boundaries of the radio frequency signal. The bias voltage can track the envelope of the radio frequency signal for a group of symbols. The voltage modulator circuit can include a capacitor coupled between a first input node configured to receive the first supply voltage and second input node configured to receive the second supply voltage. The voltage modulator circuit can include a third pair of switches configured to receive a third supply voltage and a fourth pair of switches configured to receive a fourth supply voltage. The second pair of switches can include field effect transistors. A switch of the second pair of switches can include back-to-back field effect transistors in a common-source configuration. A switch of the second pair of switches can include back-to-back field effect transistors in a common-drain configuration.

The power amplifier system can include an antenna and a quarter-wavelength transmission line between the power amplifier and the output of the voltage modulator.

Another aspect of this disclosure is a voltage multiplexer with magnetic field cancellation. The voltage multiplexer includes a first pair of switches configured to receive a first supply voltage and a second pair of switches configured to receive a second supply voltage. The first pair of switches includes a first switch of a first current loop and a second switch of a second current loop, in which the first current loop and the second current loop are configured to generate magnetic fields having opposite directions. The second pair of switches includes a third switch of a third current loop and a fourth switch of a fourth current loop, in which the third current loop and the fourth current loop are configured to generate magnetic fields having opposite directions. The voltage multiplexer is configured to generate a bias voltage that tracks an envelope of a radio frequency signal provided to a power amplifier.

The bias voltage can track the envelope of the radio frequency signal on a symbol-by-symbol basis.

The voltage multiplexer can adjust the bias voltage corresponding to symbol boundaries of the radio frequency signal.

The voltage multiplexer can include one or more additional pairs of switches with magnetic field cancellation configured to receive one or more additional supply voltages. For instance, the voltage multiplexer can include a third pair of switches with magnetic field cancellation and configured to receive a third supply voltage, and a fourth pair of switches with magnetic field cancellation and configured to receive a fourth supply voltage.

The voltage multiplexer can be included in a power amplifier system that also includes the power amplifier. The power amplifier can receive the bias voltage.

Another aspect of this disclosure is a method of generating a bias voltage with magnetic field cancellation. The method includes receiving a plurality of supply voltages and controlling pairs of switches to selectively provide one of the plurality of supply voltages as a bias voltage. The controlling adjusts the bias voltage at symbol boundaries of a radio frequency signal that is amplified by a power amplifier that receives the bias voltage. Each of the pairs of switches includes a first switch of a first current loop and a second switch of a second current loop, in which the first current loop and the second current loop generate magnetic fields having opposite directions.

The bias voltage can track the envelope of the radio frequency signal on a symbol-by-symbol basis.

The controlling can include make-before-break switching.

At least one of the pairs of switches can include a switch that includes two series field effect transistors in a junction isolation configuration.

Another aspect of this disclosure is a power amplifier system with magnetic field cancellation in envelope tracking. The power amplifier system includes a power amplifier configured to amplify a radio frequency signal and a switch-mode power supply voltage regulator circuit configured to provide a bias voltage to the power amplifier. The bias voltage tracks an envelope of the radio frequency signal. The switch-mode power supply voltage regulator circuit includes a first switch of a first current loop that also includes a first bypass capacitor and a second switch of a second current loop that also includes a second bypass capacitor. The first current loop and the second current loop are configured to generate respective magnetic fields having opposite directions. The first switch and the second switch are configured to receive a same supply voltage.

The bias voltage can continuously track the envelope of the radio frequency signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will be described, by way of non-limiting example, with reference to the accompanying drawings.

DETAILED DESCRIPTION OF CERTAIN EMBODIMENTS

Figure 1:
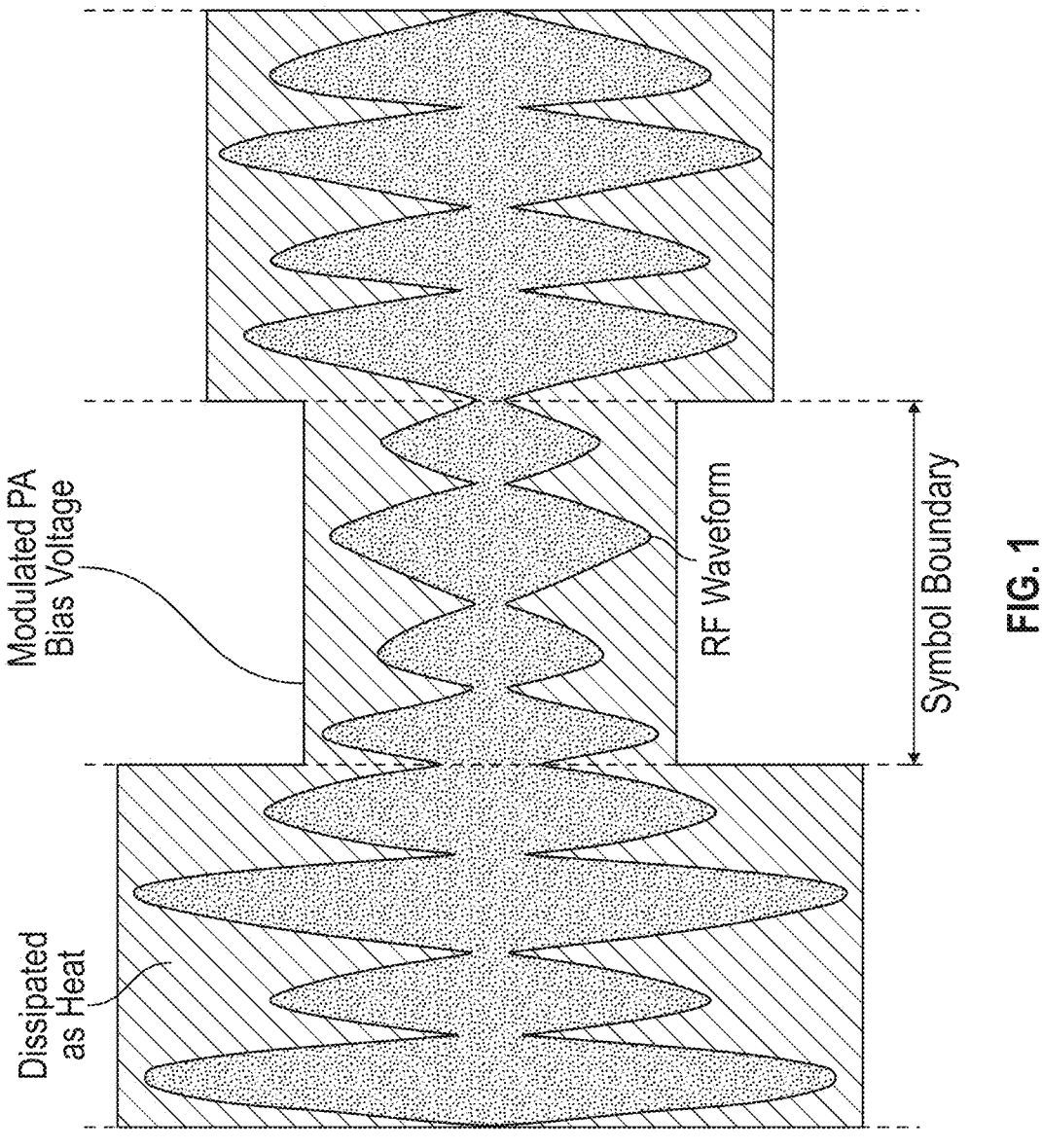
FIG. 1 is a waveform of a radio frequency (RF) signal and a modulated bias voltage that changes on a symbol-by-symbol basis.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the illustrated elements. Further, some embodiments can incorporate any suitable combination of features from two or more drawings. The headings provided herein are for convenience only and do not necessarily affect the scope or meaning of the claims.

Power amplifiers are significant components of transmitters in wireless communication systems, including fifth generation (5G) wireless communication systems. Power amplifiers can have a significant contribution to overall system power consumption, efficiency, and/or linearity. A power amplifier can drive an individual antenna element of a phased antenna array in certain applications.

A rapidly growing use of power supplies is to power radio frequency (RF) power amplifiers (PAs), such as in multiple-input, multiple-output (MIMO) cellular radios. These PAs may be configured as linear amplifiers, instead of Class-D amplifiers or other switching amplifiers, due to the technical specifications to support high frequencies. Two or more power supply voltages may be used to modulate a bias voltage of the PA to track its RF envelope. This can reduce and/or minimize power dissipation.

Voltage modulators arranged to generate envelope signals can have transition times of 10 s of nanoseconds and voltage can be stepped significantly (e.g., from 25 V to 50 V). This can result in a high slew rate. Having little to no inductance in a hot loop by implementing magnetic field cancellation disclosed herein can achieve clean transitions without significant overshooting or ringing out. This can be significant to preserving integrity of an RF signal at an output of a diplexing element.

Aspects of this disclosure relate to power amplifier systems with magnetic field cancellation in envelope tracking. A power amplifier system can include a voltage modulator circuit to generate a bias voltage that tracks an envelope of a radio frequency signal and a power amplifier configured to receive the bias voltage and amplify the radio frequency signal. The voltage modulator circuit can include a first pair of switches with magnetic field cancellation. The voltage modulator circuit can also include a second pair of switches with magnetic field cancellation, in which the first pair of switches receives a first supply voltage, and the second pair of switches is configured to receive a second supply voltage. The first and second pairs of switches can be connected to a common bias voltage output thus forming a dual input, single output voltage multiplexer. The bias voltage generated by the voltage modulator circuit can track the envelope of the radio frequency signal on a symbol-by-symbol basis. In certain applications, the voltage multiplexer can include one or more additional pairs of switches with magnetic field cancellation and where each additional pair of switches receives a different supply voltage. Each additional pair of switches can be connected to the common bias voltage output.

Magnetic field cancellation can be implemented by current loops that generate magnetic fields in opposite directions. The pair of switches can include a first switch and a second switch. The first switch can be in a first current loop that also includes a first bypass capacitor. The second switch can be in a second current loop that also includes a second bypass capacitor. The first current loop and the second current loop can generate magnetic fields having opposite directions for magnetic field cancellation.

SBET Envelope Tracking

FIG. 1 illustrates example waveforms of an RF signal and a modulated bias voltage that changes on a symbol-by-symbol basis. The PA bias voltage is modulated as a function of the RF waveform. Such bias voltage modulation can reduce power dissipation by the PA. Dissipated heat can correspond to a difference between the RF waveform and the PA bias voltage. The PA bias voltage can toggle among discrete voltage levels on a symbol-by-symbol basis. Such a technique can be referred to as symbol-based envelope tracking (SBET).

Radio Systems and Transmitter Channels

Figure 2:
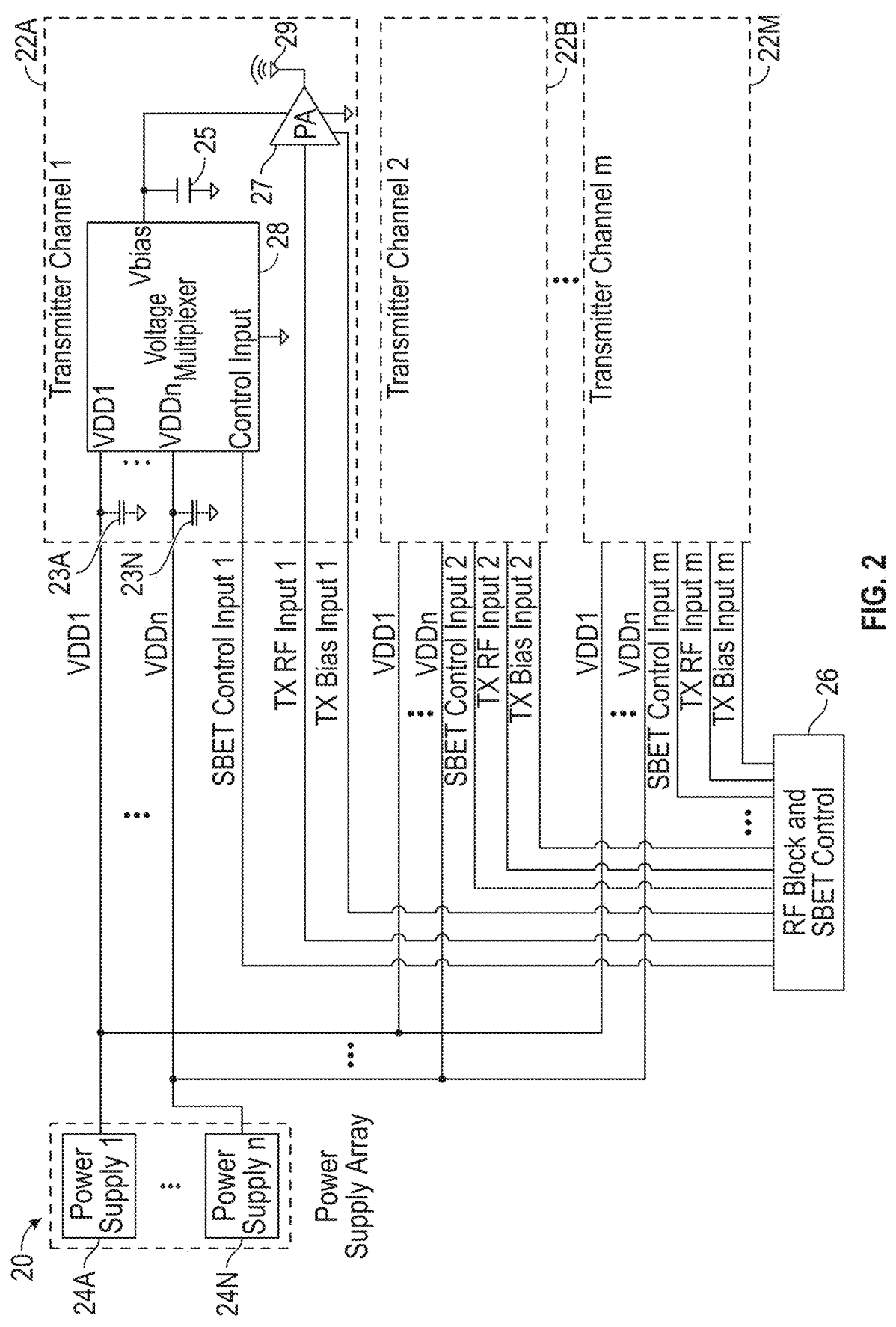
FIG. 2 is a schematic block diagram of a multiple-input, multiple-output (MIMO) radio system according to an embodiment.

FIG. 2 is a schematic block diagram of an example MIMO radio system 20 according to an embodiment. As illustrated, the MIMO system 20 includes a plurality of transmitter channels 22A, 22B, 22M, a plurality of power suppliers 24A, 24N, and an RF and SBET control block 26. The transmitter channels 22A, 22B, 22M can be referred to as RF PA transmitter channels. The plurality of transmitter channels 22A, 22B, 22M can each include a PA 27, bypass capacitors 23A to 23N, a voltage multiplexer 28, and an antenna 29. A load capacitance 25 is also illustrated in the transmitter channel 22A. A voltage modulator circuit can include the bypass capacitors 23A, 23N and the voltage multiplexer 28. Any suitable positive integer number M of transmitter channels can be implemented. For example, in certain applications, there can be 8 to 128 transmitter channels.

The voltage multiplexer 28 can implement SBET biasing of the PA 27. The voltage multiplexer 28 can have two or more supply voltage inputs and one output. The supply voltage inputs of the voltage multiplexer 28 are configured to receive voltages generated from respective power supplies 24A, 24N. As illustrated in FIG. 2, the power supplies 24A, 24N can be included in a power supply array. Any suitable positive integer number N of power supplies can be implemented. For example, in certain applications, there can be 2 power supplies or 4 power supplies. The output of the voltage multiplexer 28 can be connected to the PA 27 to provide a bias voltage Vbias for the PA 27. Input bypass capacitors 23A and 23N can be positioned in proximity with the voltage multiplexer 28 to reduce and/or minimize parasitic inductance.

Power supply voltages VDD1 to VDDn from the power supplies 24A, 24N can be provided to two or more transmitter channels 22A, 22B, 22M. The power supplies 24A to 24N can be implemented as discrete voltage sources. The power supplies 24A to 24N can be implemented as voltage sources in series.

The RF and SBET control block 26 can generate an RF input signal (e.g., one of TX RF Input 1 to TX RF Input M) for the PA 27, a second bias input signal (e.g., one of TX Bias Input 1 to TX Bias Input M) for the PA 27, and one or more voltage multiplexer control signals (e.g., one of SBET Control Input 1 to SBET Control Input M) for each channel. The one or more voltage multiplexer control signals can control switches of the voltage multiplexer 28 to select a bias voltage Vbias that tracks the envelope of the RF signal. Each voltage multiplexer 28 can include a decoder to decode the one or more voltage multiplexer control signals in certain applications. A voltage level of the bias voltage Vbias can be adjusted corresponding to symbol boundaries of the RF signal. The bias voltage Vbias can track the envelope of the RF signal on a symbol-by-symbol basis. In some instances, the bias voltage Vbias can track the envelope of the RF signal for a group of symbols and/or for each individual symbol. The bias voltage Vbias can be applied to an output (e.g., a drain) of the PA 27. The second bias input signal for the PA 27 can be a bias signal for an input terminal (e.g., a gate) of the PA 27.

The power delivered from the power supplies 24A, 24N can be limited by circuit breakers and/or fuses. Alternatively, the voltage multiplexer 28 can incorporate electronic circuit breaker protection. In such instances, the voltage multiplexer 28 of each transmitter channel 22A to 22M can provide electronic circuit breaker protection.

The PA 27 can amplify the RF input signal. The PA 27 can be implemented by any suitable transistors. In certain applications, the PA 27 can include a gallium nitride (GaN) field effect transistor. The antenna 29 can be coupled to the output of the PA 27. The antenna 29 can transmit an output signal. Antennas 29 of the transmitter channels 22A, 22B, 22M can perform beamforming in certain applications.

Figure 3:
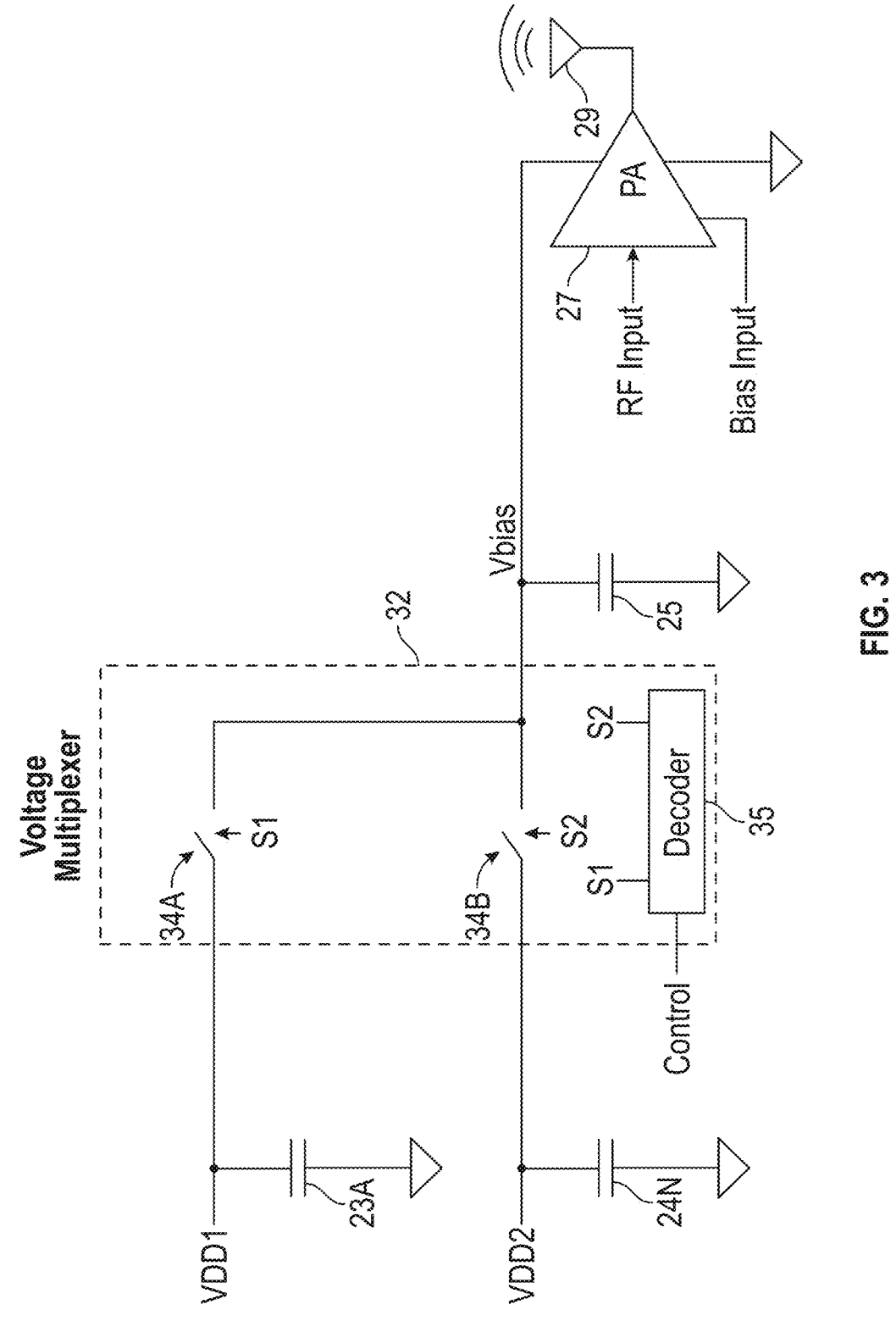
FIG. 3 is a schematic diagram of a radio transmitter channel with a dual input bias voltage multiplexer for biasing an RF power amplifier.

FIG. 3 is a schematic diagram of a transmitter channel 30 with a dual input bias voltage multiplexer 32 for biasing a PA 27. The transmitter channel 30 is configured to receive two different supply voltages VDD1 and VDD2. The voltage multiplexer 32 is configured to modulate the bias voltage Vbias by actuating switches 34A and 34B to selectively electrically connect input nodes at the supply voltages VDD1 and VDD2, respectively, to the output node that provides the bias voltage Vbias. The voltage multiplexer 32 can include a decoder 35 to control switching of the switches 34A and 34B to generate the bias voltage Vbias at discrete voltage levels. The decoder 35 can provide binary output signals to control switches 34A and 34B. The decoder 35 can decode a control signal Control. In some applications, the decoder 35 can receive a ternary level input control signal to actuate the switches 34A and 34B where the third level is decoded to open both switches simultaneously. The control signal Control can be provided by a control block, such as the RF and SBET control block 26 of FIG. 2.

Modulation of the PA bias voltage Vbias can significantly reduce power dissipation. However, there are technical challenges with implementing a multiplexer in practice due to technical specifications for the bias voltage Vbias to change quickly in response to a control signal. For example, power supply and switch parasitic inductances can limit a rate of current change, and multiplexer load capacitance can limit a rate of bias voltage change. Consequently, parasitic inductance and load capacitance of tracking power supplies can limit the ability of the multiplexer to quickly change the PA bias voltage Vbias in response to the control signal.

A bias voltage multiplexer implementation that reduces and/or minimizes parasitic inductances associated with switches and bypass capacitors of the power supplies at the input of the multiplexer to reduce and/or minimize the load capacitance at the output of the multiplexer would be desirable. The switches 34A and 34B of the voltage multiplexer 32 can each be implemented by respective pair of switches with magnetic field cancellation to reduce and/or minimize parasitic inductance. Examples of such pairs of switches will be discussed with reference to FIGS. 5-7 and 9-13.

Generating Bias Voltage with Magnetic Field Cancellation in Voltage Modulator Circuits and Related Systems Two switches and associated bypass capacitors can split single magnetic loops into two magnetic loops with linked opposing magnetic fields, to cause a cancelling effect and achieve a lower overall magnetic field. This can result in lower parasitic inductance associated with the switches as well as the associated input bypass capacitors. The magnetic loops can be referred to as current loops. Current through such a loop can generate a magnetic field.

Figures 4, 5:
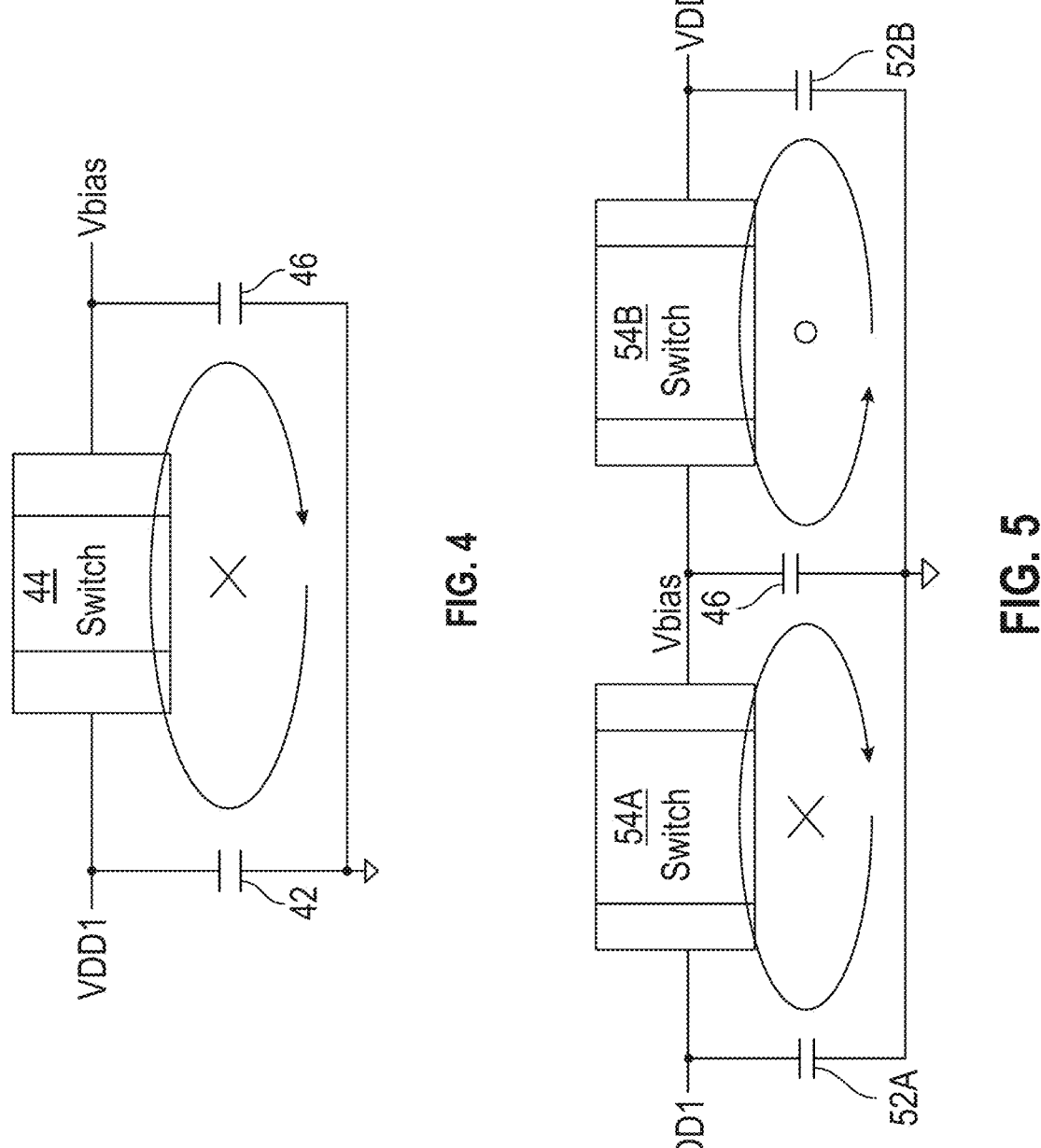
FIG. 4 is a schematic diagram of bypass capacitor and a switch of a current loop.
FIG. 5 is a schematic diagram of switches and associated bypass capacitors with magnetic field cancellation.

FIG. 4 is a schematic diagram of a bypass capacitor 42 and a switch 44 of a voltage multiplexer. A current loop that includes the bypass capacitor 42, the switch 44, and a load capacitance 46 can generate a magnetic field, thereby causing inductance. In FIG. 4, the magnetic field can be generated in a direction into the plane of the page.

FIG. 5 is a schematic diagram of a pair of switches 54A, 54B and associated bypass capacitors 52A, 52B with magnetic field cancellation. A first current loop that includes the first switch 54A and the first bypass capacitor 52A can generate a first magnetic field in a first direction (e.g., into the plane of the page). A second current loop that includes the second switch 54B and the second bypass capacitor 52B can generate a second magnetic field in a second direction (e.g., out of the plane of the page), where the second direction is opposite to the first direction. The first and second magnetic fields are opposing magnetic fields that can cancel each other. The first and second magnetic fields can have approximately the same magnitude and opposite directions for such cancellation. Magnetic field cancellation can be significant, even though such magnetic field cancellation may not completely cancel the first and second magnetic fields. The lower magnetic field from magnetic field from cancellation can reduce inductance.

Magnetic field cancellation techniques can be implemented for generating a bias voltage from a plurality of supply voltages and/or for generating a bias voltage for a power amplifier in envelope tracking applications. While embodiments disclosed herein may relate to 2 supply voltages or 4 supply voltages, the principles and advantages disclosed herein can be applied to generating a bias voltage that tracks an envelope signal from any suitable number of supply voltages. Although embodiments disclosed herein may include 2 or 4 pairs of switches and corresponding pairs of bypass capacitors, any suitable number of pairs of switches and corresponding pairs of bypass capacitors can be implemented in accordance with any suitable principles and advantages disclosed herein.

Figure 6:
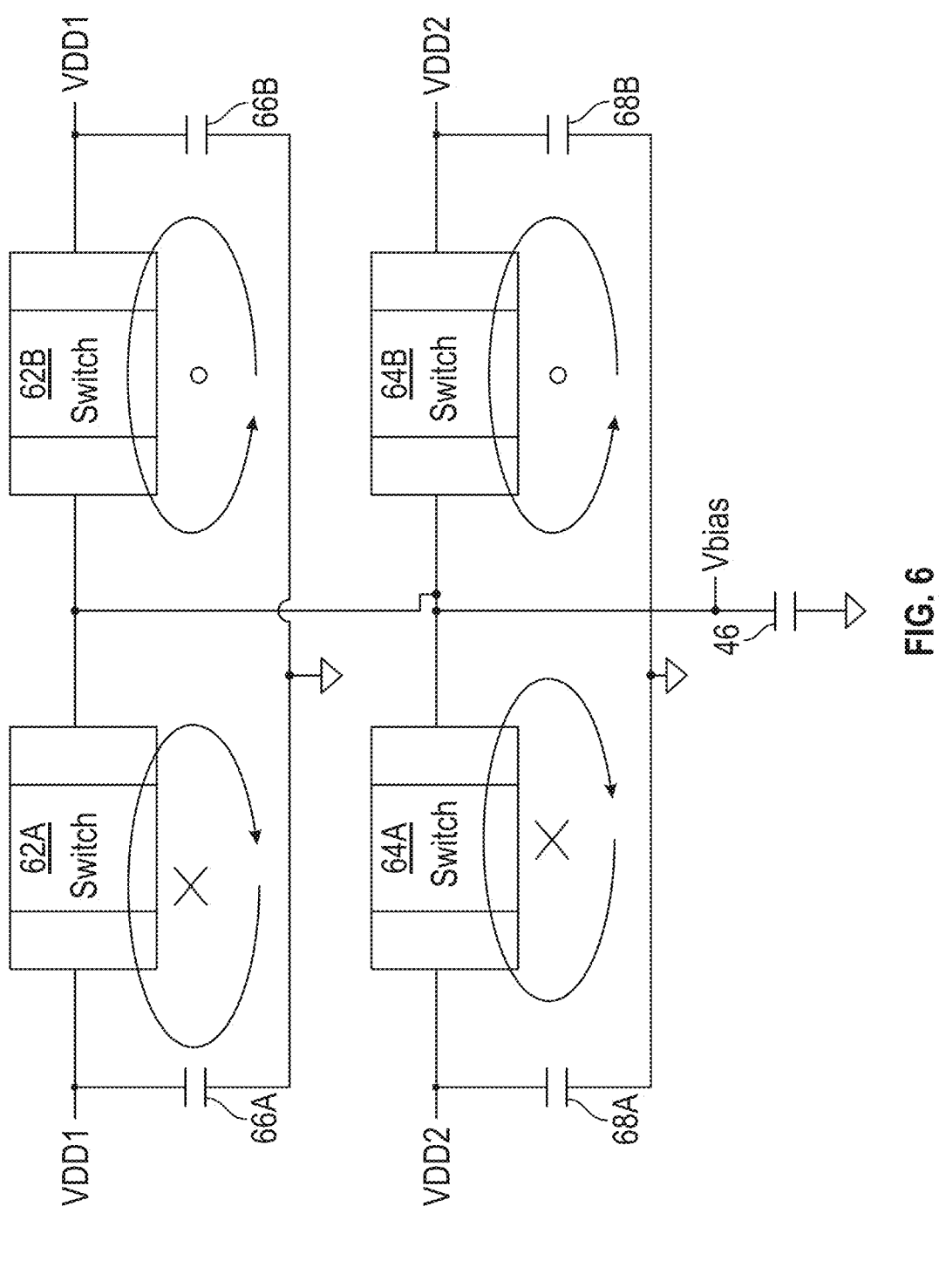
FIG. 6 is a schematic diagram of a dual-input, single output bias voltage multiplexer with magnetic field cancellation according to an embodiment.

FIG. 6 is a schematic diagram of a dual-input, single output bias voltage multiplexer 60 with magnetic field cancelation according to an embodiment. The dual input, single output bias voltage multiplexer 60 can generate a bias voltage Vbias for a PA that tracks the envelope of the RF signal amplified by the PA. The bias voltage Vbias can toggle corresponding to symbol boundaries of the RF signal. The bias voltage can toggle between discrete voltage levels on a symbol-by-symbol basis. The bias voltage Vbias can toggle between discrete voltage levels for selected groups of symbols. The dual input, single output bias voltage multiplexer 60 includes opposite and opposing switch pairs and bypass capacitor pairs. A voltage modulator can include the dual input, single output bias voltage multiplexer 60 and/or any other suitable voltage multiplexer disclosed herein. The switches of the dual input, single output bias voltage multiplexer 60 and any other voltage multiplexer disclosed herein can be controlled based on one or more switch control signals, which can be provided by any suitable control circuit such as control circuitry of the RF and SBET control block 26 of FIG. 2. In some instances, the one or more switch control signals can be decoded by a decoder, such as the decoder 35 of FIG. 3 or any other suitable decoder, and outputs of the decoder can be provided to control terminals of the switches.

Referring to FIG. 6, a first switch pair includes switches 62A and 62B coupled between first input nodes that receive a first supply voltage VDD1 and an output node that provides a bias voltage Vbias. A second switch pair includes switches 64A and 64B that are coupled between second input nodes that receive a second supply voltage VDD2 and the output node that provides the bias voltage Vbias. The first capacitor pair includes capacitors 66A and 66B that are electrically in parallel. Similarly, a second capacitor pair includes capacitors 68A and 68B that are electrically in parallel. When the output node is to be connected to the first input nodes that receive the first supply voltage VDD1, both switches 62A and 61B are turned on. Similarly, when the output node is to be connected to the second input nodes that receive the second supply voltage VDD2, both switches 64A and 64B are enabled.

In the dual-input, single output bias voltage multiplexer 60, the first switch 62A and the first capacitor 66A are included in a first current loop. The second switch 62B and the second capacitor 66B are included in a second current loop. The first current loop and the second current loop are configured to generate magnetic fields having opposite directions. This can provide magnetic field cancellation. Magnetic field cancellation can be significant, even if the magnetic fields from the first and second current loops do not completely cancel.

The third switch 64A and the third capacitor 68A are included in a third current loop. The fourth switch 64B and the fourth capacitor 68B are included in a fourth current loop. The third current loop and the fourth current loop are configured to generate magnetic fields having opposite directions. This can provide magnetic field cancellation.

The configuration of the dual-input, single output bias voltage multiplexer 60 can reduce and/or minimize parasitic inductances associated with the switches as well as the associated input bypass capacitors. This can reduce and/or minimize the technical specification for output capacitance Cload.

Figure 7:
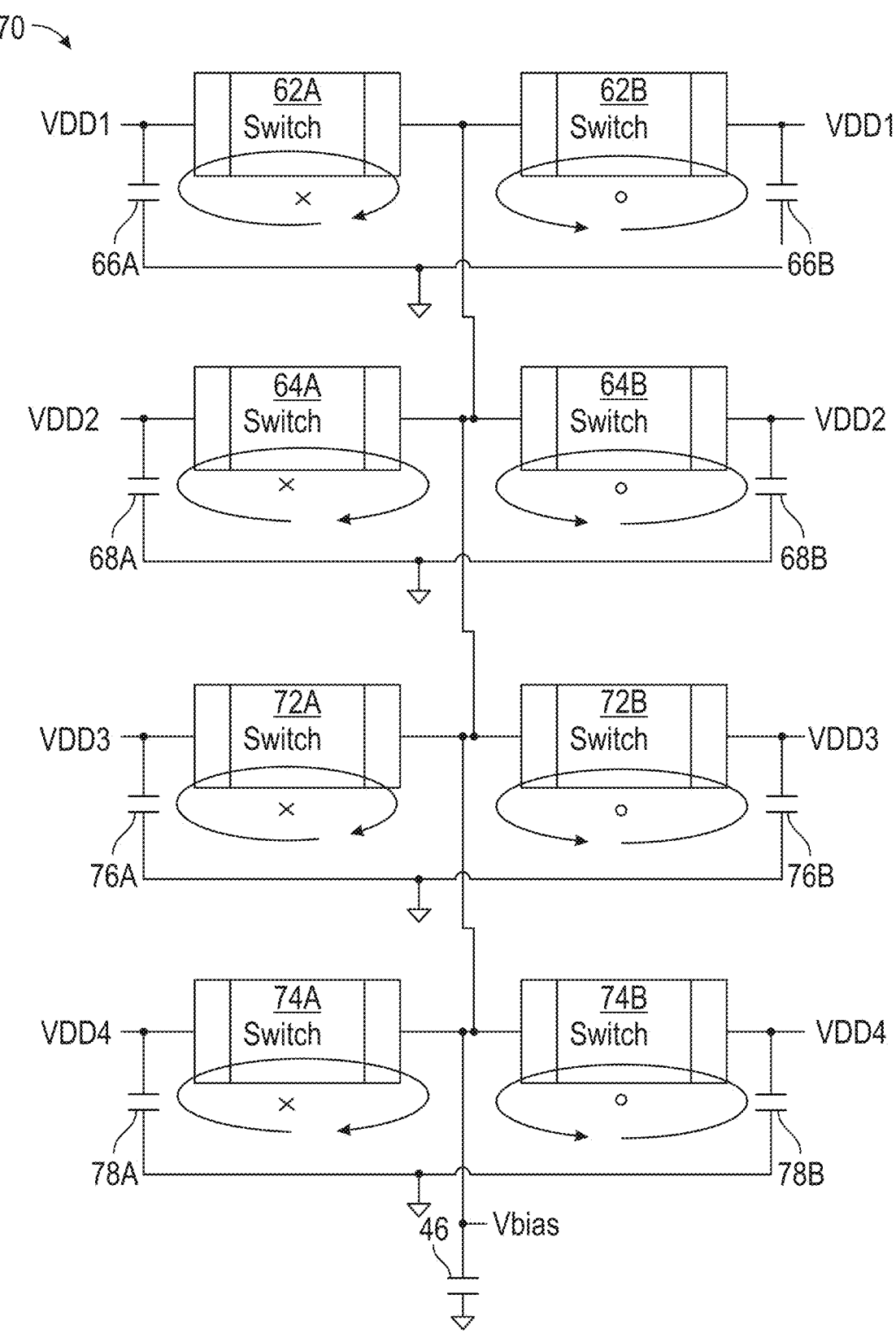
FIG. 7 is a schematic diagram of a quad-input, single output bias voltage multiplexer with magnetic field cancellation according to an embodiment.

FIG. 7 is a schematic diagram of a quad-input, single output bias voltage multiplexer 70 with magnetic field cancelation according to an embodiment. FIG. 7 illustrates an opposite and opposing switch pair and bypass capacitor pair approach for a quad input, single output PA bias voltage multiplexer. In this embodiment, 4 pairs of opposing switches and 4 pairs of input bypass capacitors are included. The quad-input, single output bias voltage multiplexer 70 is like the dual-input, single output bias voltage multiplexer 60 of FIG. 6, except that two additional pairs of switches 72A, 72B and 74A, 74B and two additional pairs of bypass capacitors 76A, 76B and 78A, 78B are included in the quad-input, single output bias voltage multiplexer 70. The additional switch pairs receive different supply voltages. The quad input, single output bias voltage multiplexer 70 can generate a bias voltage Vbias from four supply voltages VDD1, VDD2, VDD3, and VDD4. The bias voltage Vbias can toggle corresponding to a symbol boundary. The bias voltage Vbias can track an envelope of a RF signal on a symbol-by-symbol basis.

Figure 8A:
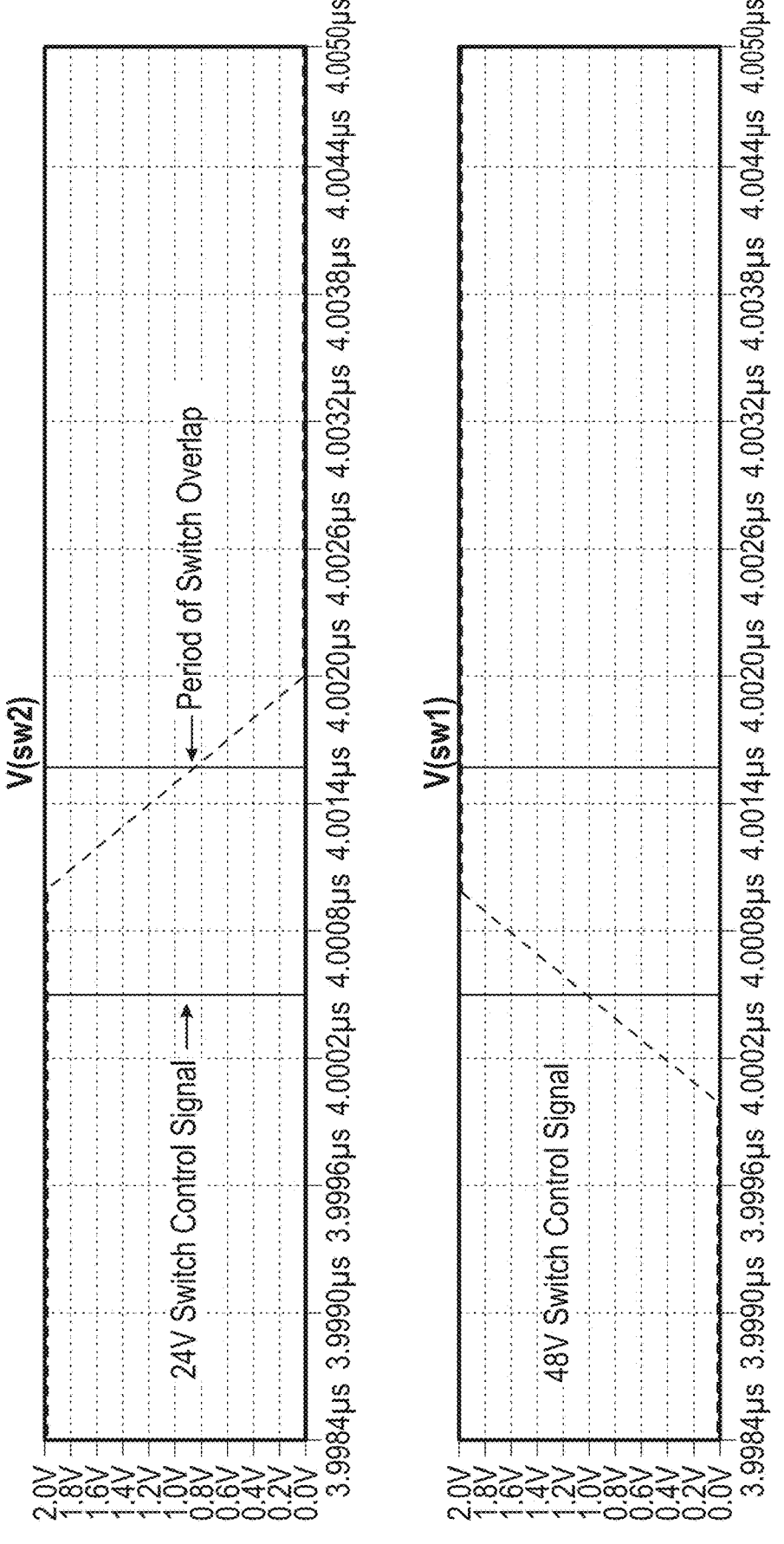
FIGS. 8A, 8B, and 8C include example waveforms for a dual-input, single output bias voltage multiplexer during make-before-break-switching according to an embodiment.
Figure 8B:
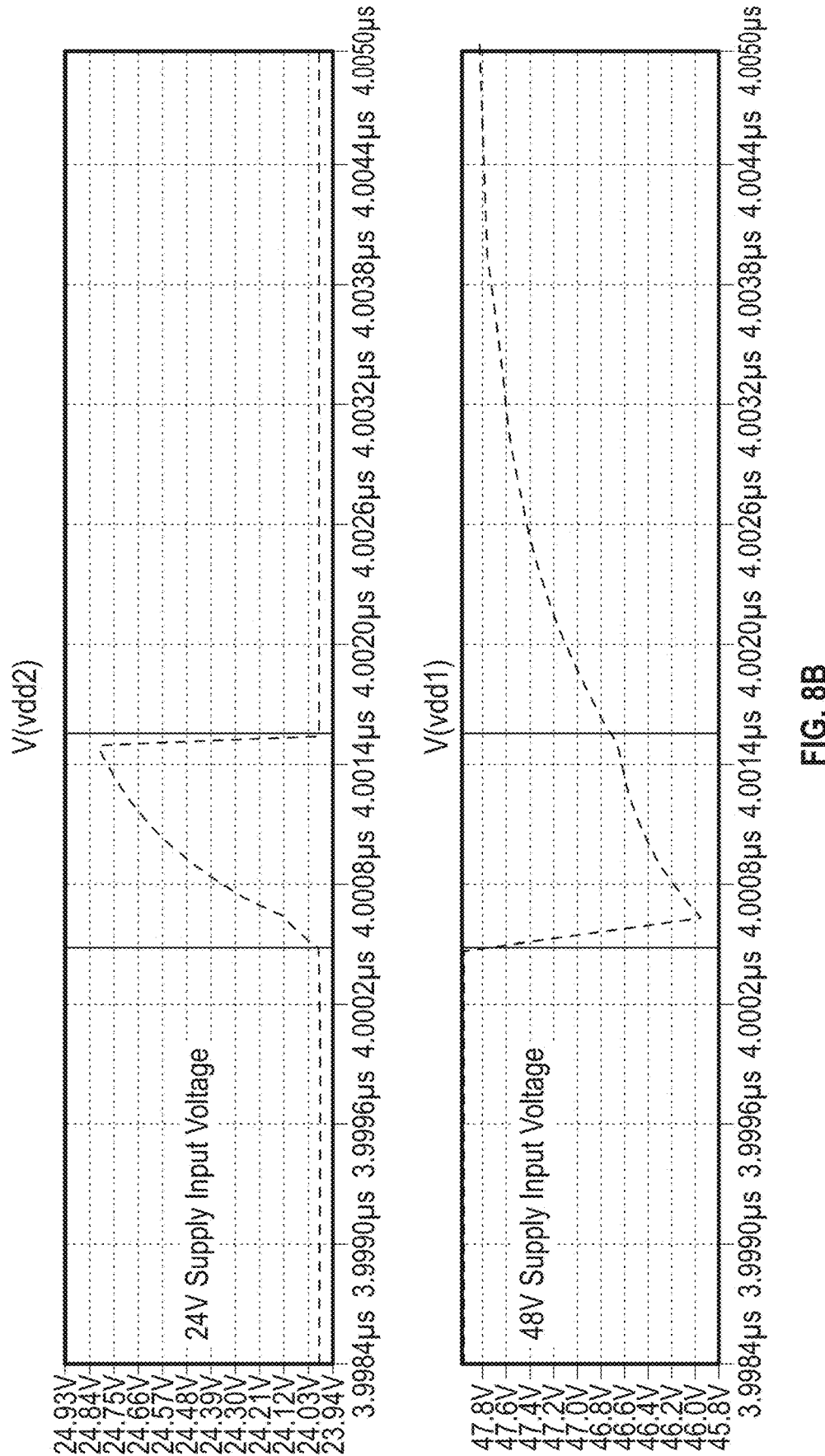
Figure 8C:
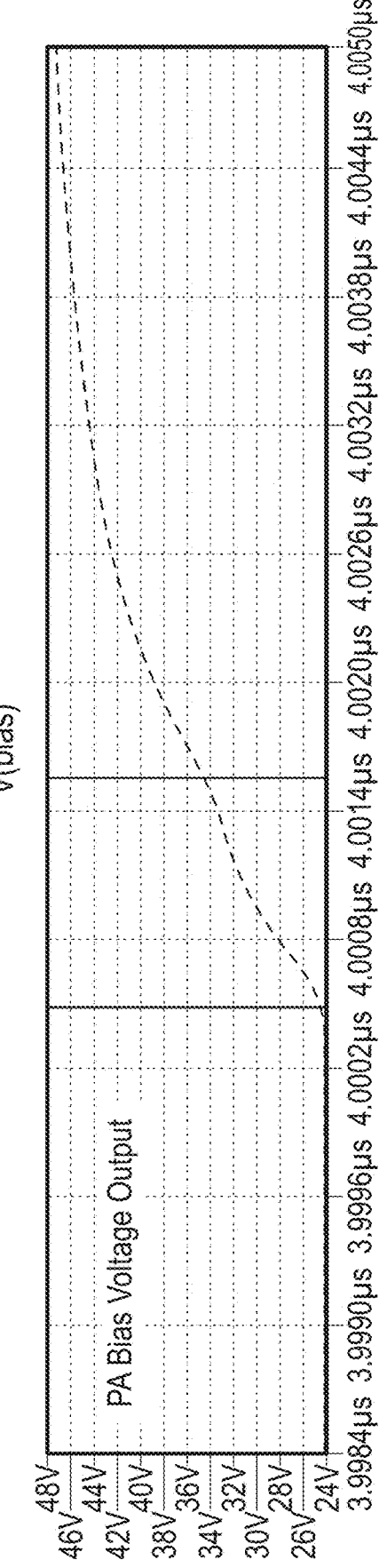

FIGS. 8A, 8B, and 8C include example waveforms for a dual-input, single output bias voltage multiplexer during make-before-break-switching according to an embodiment. The example waveforms include two switch control signal waveforms in FIG. 8A, two supply voltage waveforms in FIG. 8B, and a bias voltage waveform in FIG. 8C. As indicated in FIG. 8B, the dual input supply voltages include a 48 Volt (V) first supply voltage VDD1 and a 24 V second supply voltage VDD2. FIGS. 8A, 8B, and 8C illustrate example waveforms during a rising edge transition of the bias voltage output with make-before-break switching. The waveforms in FIGS. 8A to 8C correspond to a switch passing the first supply voltage VDD1 turning on before another switch passing the second supply voltage VDD2 turns off for transitioning the bias voltage between the second supply voltage VDD2 to the first supply voltage VDD1.

For applications with make-before-break switching in a voltage multiplexer, bypass capacitors coupled between the input supply voltage terminals can be advantageous. In an application corresponding to the waveforms of FIG. 8, a bypass capacitor coupled between nodes that receive supply voltages VDD1 and VDD2 can see both the positive voltage excursion of the 24 V input and the negative voltage excursion of the 48 V input across its terminals during the switch overlap period. This capacitor may have the additional advantages of only being exposed to the voltage difference between the 48 V and 24 V inputs as well as not being implemented by two (or more) series capacitors.

Figure 9:
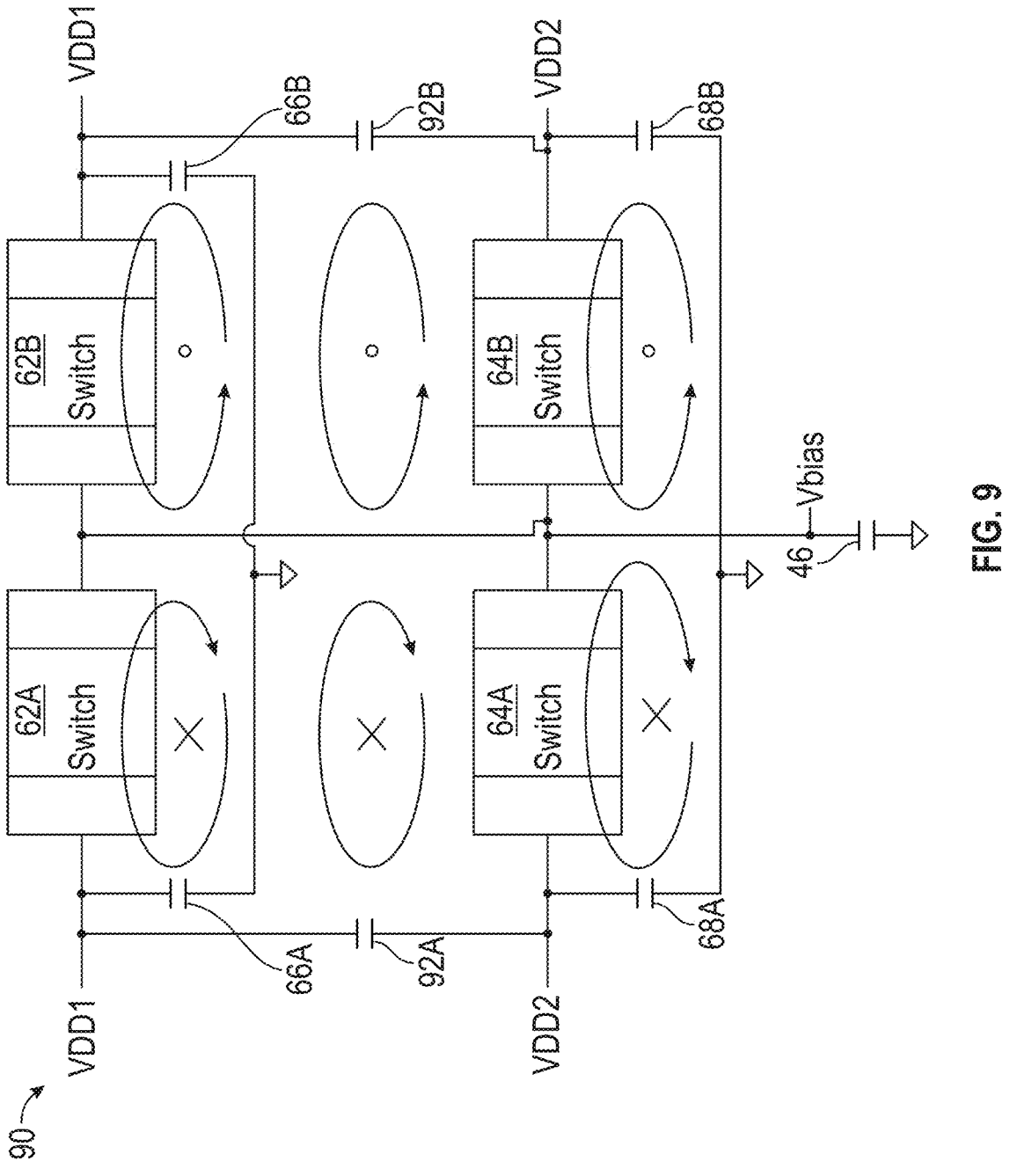
FIG. 9 is a schematic diagram of a dual-input, single output bias voltage multiplexer that includes a pair of bypass capacitors coupled between supply voltages according to an embodiment.

FIG. 9 is a schematic diagram of a dual-input, single output bias voltage multiplexer 90 that includes a pair of bypass capacitors 92A and 92B coupled between supply voltages VDD1 and VDD2 according to an embodiment. The pair of bypass capacitors 92A and 92B is a pair of opposite and opposing capacitors. The dual-input, single output bias voltage multiplexer 90 is like the dual-input, single output bias voltage multiplexer 60, except that the bypass capacitors 92A and 92B are additionally included. With the bypass capacitors 92A and 92B, additional current loops with magnetic field cancellation can be formed. The bypass capacitors 92A and 92B connected between input nodes that receive power supply voltages VDD1 and VDD2 can reduce and/or minimize parasitic inductances in the dual input, single output bias voltage multiplexer 90. Accordingly, the dual input, single output bias voltage multiplexer 90 can have lower parasitic inductances compared to the dual input, single output bias voltage multiplexer 60 of FIG. 6. The dual input, single output bias voltage multiplexer 90 can be implemented in applications with make-before-break switching, for example.

Figure 10A:
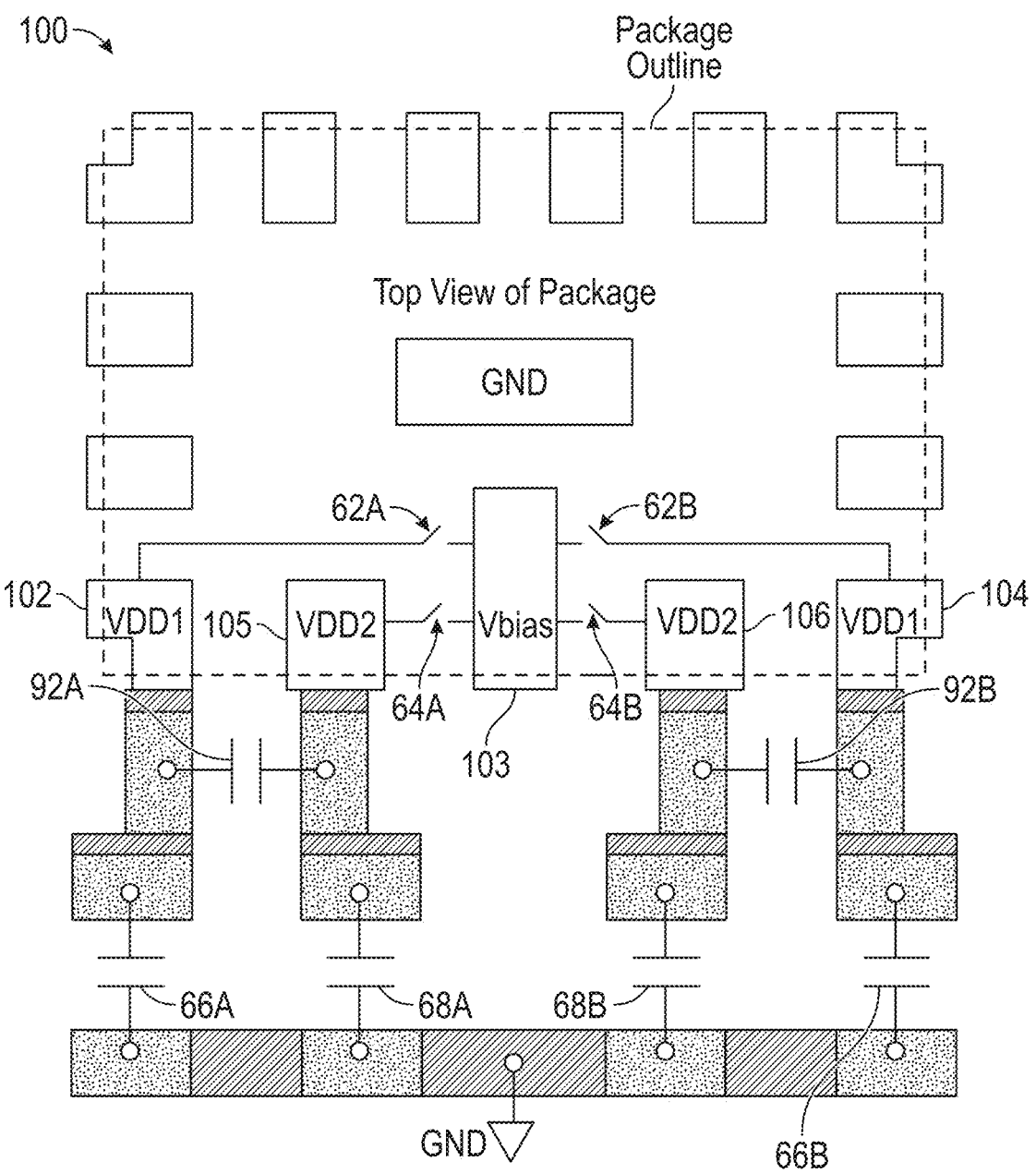
FIG. 10A is a schematic diagram of an example package pinout and placement of external bypass capacitors for the dual-input, single output bias voltage multiplexer of FIG. 9 according to an embodiment.

FIG. 10A is a schematic diagram of an example package pinout and placement of external bypass capacitors for the dual-input, single output bias voltage multiplexer 90 of FIG. 9 according to an embodiment. A packaged component 100 can include switches 62A, 62B, 64A, 64B.

The switches 62A, 62B, 64A, 64B can be connected between terminals (e.g., pins) of the packaged component 100. As illustrated in FIG. 10A, the switch 62A can be connected between a first input terminal 102 configured to receive the first power supply voltage VDD1 and an output terminal 103 configured to provide the bias voltage Vbias. The switch 62B can be connected between a second input terminal 104 configured to receive the first power supply voltage VDD1 and the output terminal 103. The switch 64A can be connected between a third input terminal 105 that is configured to receive the second power supply voltage VDD2 and the output terminal 103. The switch 64B can be connected between a fourth input terminal 106 that is configured to receive the second power supply voltage VDD2 and the output terminal 103.

The bypass capacitors 66A, 66B, 68A, 68B, 92A, and 92B can be implemented external to the packaged component 100. An example placement of these bypass capacitors is shown in FIG. 10A. FIG. 10A shows symmetrical layout for switches, terminals of the packaged component 100, and bypass capacitors.

Figure 10B:
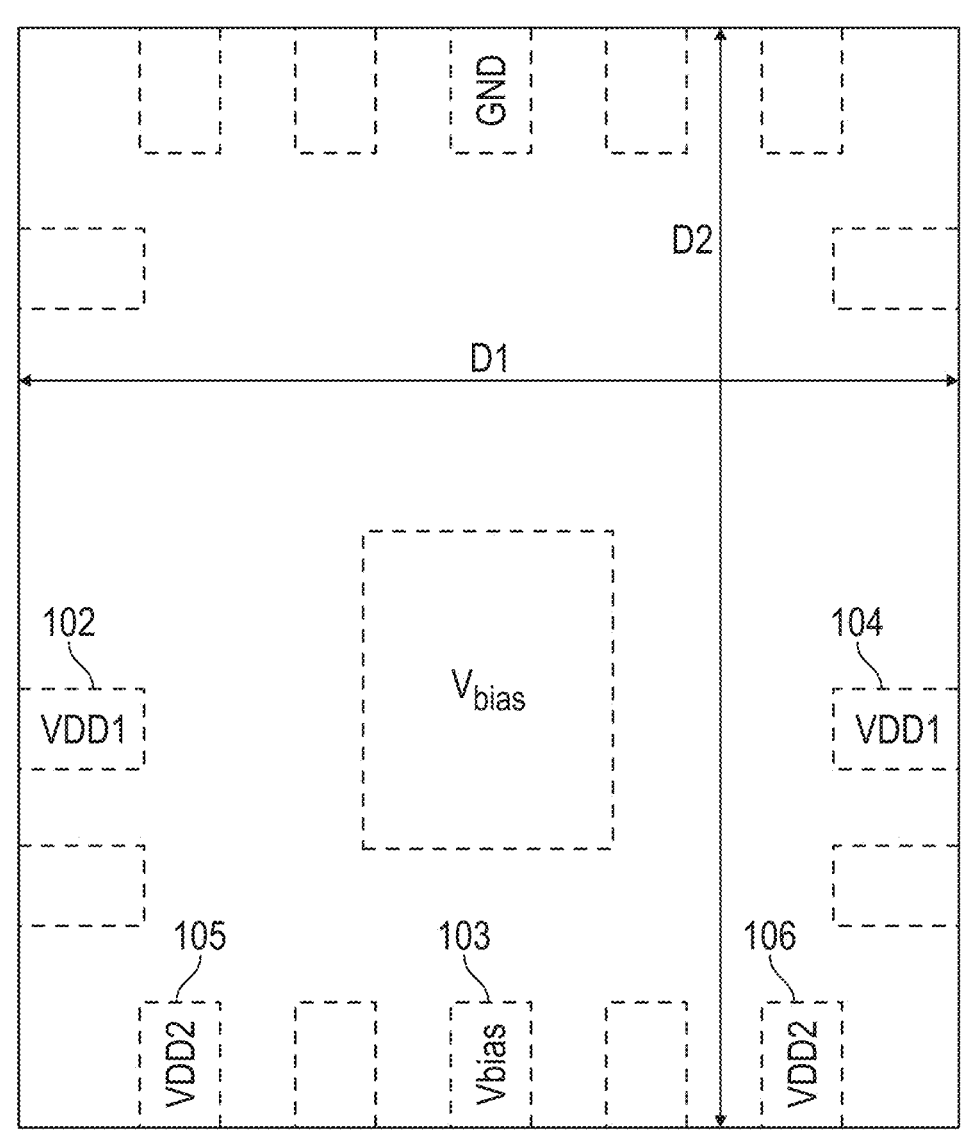
FIG. 10B is a schematic diagram of another example package pinout according to an embodiment.

A packaged component that includes switches for a voltage multiplexer can be any suitable size for a particular application. FIG. 10B is a schematic diagram of another example package pinout according to an embodiment. A packaged component 108 of FIG. 10B has a different size than the packaged component 100 of FIG. 10A. As one example, the packaged component 108 can be 3 millimeters (mm) along a first dimension D1 and 3.5 mm along a second dimension D2.

The packaged component 108 can include switches of a voltage multiplexer that are connected to bypass capacitors that are external to the packaged component. The switches of the packaged component 108 can be connected between terminals (e.g., pins) of the packaged component 108, for example, as discussed with reference to FIG. 10A. The packaged component 108 includes a different arrangement of the input terminals 102, 104, 105, 106 and output terminal 103 than the packaged component 100 of FIG. 10A.

For voltage modulators, there can be symmetrical layout for switches, terminals of the packaged component, and bypass capacitors. Terminals for receiving each supply voltage can be symmetric about the output terminal that provides a bias voltage. In both the packaged component 108 of FIG. 10B and the packaged component 100 of FIG. 10A, the input terminals 102 and 104 that receive the first power supply voltage VDD1 are symmetric about the output terminal 103. In both the packaged component 108 of FIG. 10B and the packaged component 100 of FIG. 10A, the input terminals 105 and 106 that receive the second power supply voltage VDD2 are symmetric about the output terminal 103. The symmetry for layout of the bypass capacitors and switches shown in FIG. 10A can be implemented with the packaged component 108 of FIG. 10B.

The switches of embodiments disclosed herein can be implemented by any suitable circuit elements. Example switches include, but are not limited to, transistors, field effect transistors, n-channel field effect transistors, p-channel field effect transistors, metal oxide semiconductor field effect transistors (MOSFETs). In certain applications, a switch can include two or more transistors in series with each other, e.g., back-to-back common source MOSFETs, back-to-back common drain MOSFETs, or the like. Alternatively, or additionally, a switch can be implemented by two or more transistors in parallel with each other. In some instances, a switch can be implemented by transistors by a combination of parallel and series transistors.

Switches can be implemented by back-to-back MOS-FETs. In certain applications such as discontinuous PA transmission (DTX), a bias voltage can be discharged below a lowest input voltage (e.g., ground). Back-to-back common source MOSFETs or back-to-back common drain MOSFETs can be implemented to isolate a supply voltage input from a bias voltage output. Back-to-back common source MOS-FETs or back-to-back common drain MOSFETs can be implemented to isolate all supply voltage inputs from a bias voltage output. Back-to-back MOSFETs can also disconnect a load in the case of a fault instead of a fuse. Envelope trackers and PAs can be included in one transmission channel of a plurality of transmission channels (e.g., 8 to 128 transmission channels) that are connected to a common supply voltage (e.g., VDD2). If there is fault in one of the channels, that transmission channel can be isolated from other transmission channels by the back-to-back MOSFETs. Example embodiments with back-to-back MOSFETs will be discussed with reference to FIGS. 11 to 13.

Figure 11:
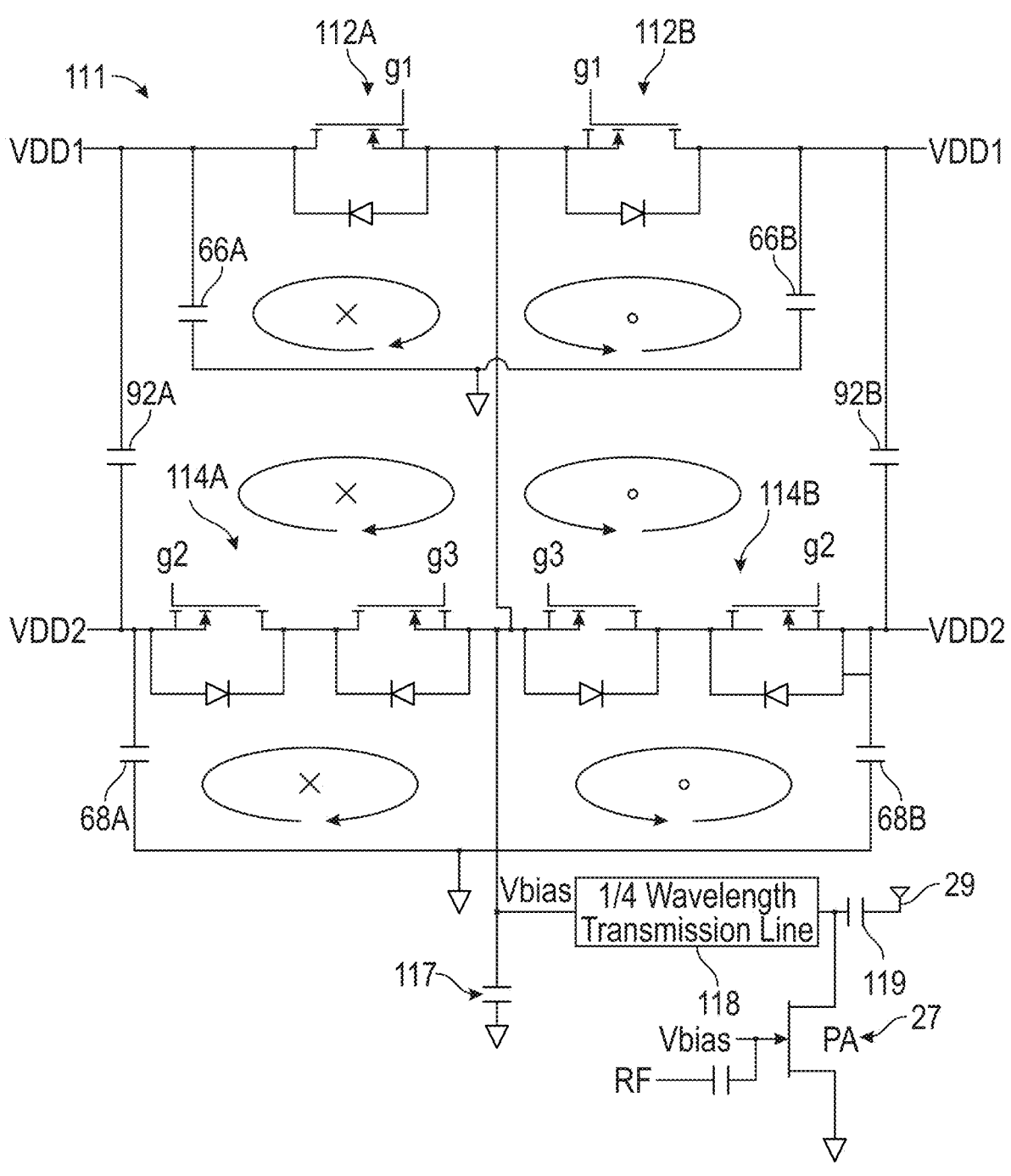
FIG. 11 is a schematic diagram of a radio frequency system that includes a dual-input, single output bias voltage multiplexer that includes metal oxide semiconductor field effect transistor (MOSFET) switches to an embodiment.

FIG. 11 is a schematic diagram of power amplifier system 110 that includes a dual-input, single output bias voltage multiplexer 111 that includes MOSFET switches to an embodiment. The dual input, single output bias voltage multiplexer 111 includes two pairs of opposite and opposing switches and capacitors where the switches are realized with N-channel MOSFETs. The MOSFETs may have body diodes connected between their source and drain terminals resulting from the body of each device being connected to its source terminal. Body diodes are illustrated in FIGS. 11, 12, 13A, and 13B.

The opposite and opposing switches 112A and 112B connecting the input nodes that receive the first supply voltage VDD1 to the output node that provides the bias voltage Vbias can each comprise a MOSFET. The dual-input, single output bias voltage multiplexer 111 includes common-drain junction isolated MOSFETs. The opposite and opposing switches 114A and 114B connecting the input nodes that receive the second supply voltage VDD2 to the output node that provides the bias voltage Vbias can each comprise two series MOSFETs in a back-to-back, common-drain configuration. Accordingly, the output bias voltage Vbias can be pulled to ground when the MOSFETs are biased in cutoff without shorting the input nodes that receive the second supply voltage VDD2 through a body diode. The ability to isolate the output node that provides the bias voltage Vbias from the input nodes can be used during normal operation or when a fault condition exists, e.g., a circuit breaker trip.

In the dual-input, single output bias voltage multiplexer 111, bypass capacitors 66A, 66B, 68A, 68B, 92A, and 92B are connected similarly as in the dual-input, single output bias voltage multiplexer 90 of FIG. 9.

In the power amplifier system 110, a PA 27 is illustrated as a common source amplifier with drain connections to a diplexer 118 and an antenna 29. The diplexer 118 can be implemented by a quarter-wavelength transmission line connected between the output node that provides the bias voltage Vbias and the drain of the PA 27. The drain of the field effect transistor of the PA 27 can be alternating current (AC) coupled to the antenna 29 by a direct current (DC) blocking capacitor 119. Load capacitance 117 can be connected in shunt with the output node providing Vbias. Capacitance 117 can be comprised of a capacitor with a self-resonant frequency centered on the RF signal being transmitted by the antenna 29.

Figure 12:
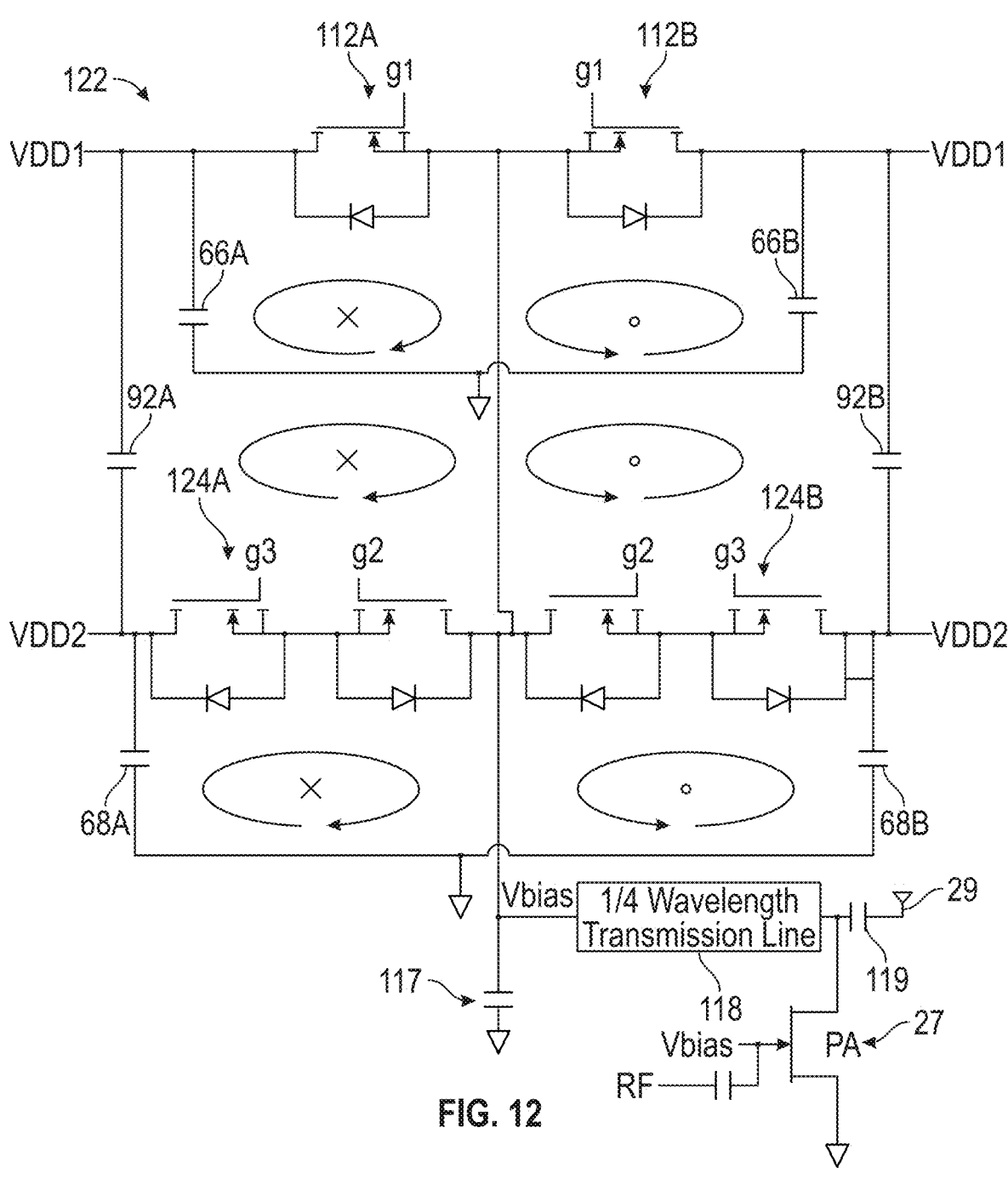
FIG. 12 is a schematic diagram of a radio frequency system that includes a dual-input, single output bias voltage multiplexer that includes common-source junction isolated MOSFET switches according to another embodiment.

FIG. 12 is a schematic diagram of a power amplifier system 120 that includes a dual-input, single output bias voltage multiplexer 122 that includes MOSFET switches according to an embodiment. The dual-input, single output bias voltage multiplexer 122 is like the dual-input, single output bias voltage multiplexer 111 of FIG. 11, except that back-to-back MOSFET switches 124A and 124B connecting input nodes that receive the second supply voltage VDD2 to the output node that provides the bias voltage Vbias are in a common-source configuration.

Figure 13A:
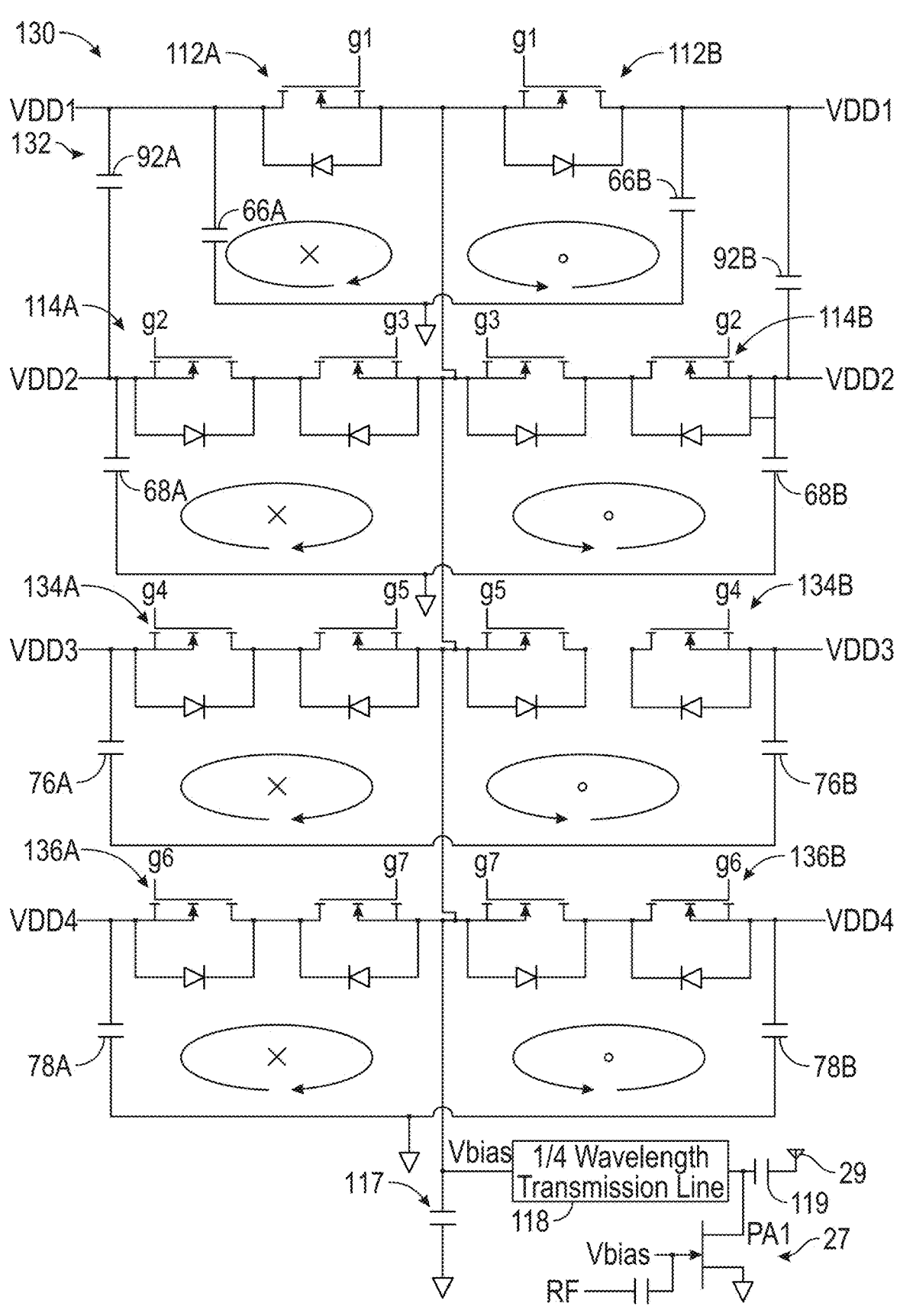
FIG. 13A is a schematic diagram of a radio frequency system that includes a quad-input, single output bias voltage multiplexer that includes MOSFET switches according to an embodiment.

FIG. 13A is a schematic diagram of a power amplifier system 130 that includes a quad-input, single output bias voltage multiplexer 132 according to an embodiment. The quad-input, single output bias voltage multiplexer 132 includes opposite and opposing MOSFET switches and capacitors. In the quad-input, single output bias voltage multiplexer 132, input nodes that receive supply voltages VDD2, VDD3, and VDD4 are connected to the output node that provides the bias voltage Vbias through back-to-back MOSFET switches 114A and 114B, 134A and 134B, and 136A and 136B, respectively. These back-to-back MOSFET switches are common-drain MOSFET switches as illustrated. In addition to the input bypass capacitor pairs returning to ground, bypass capacitor pair 92A, 92B between inputs VDD1 and VDD2 are included. Additional input-to-input bypass capacitor pairs can be included as suitable.

Figure 13B:
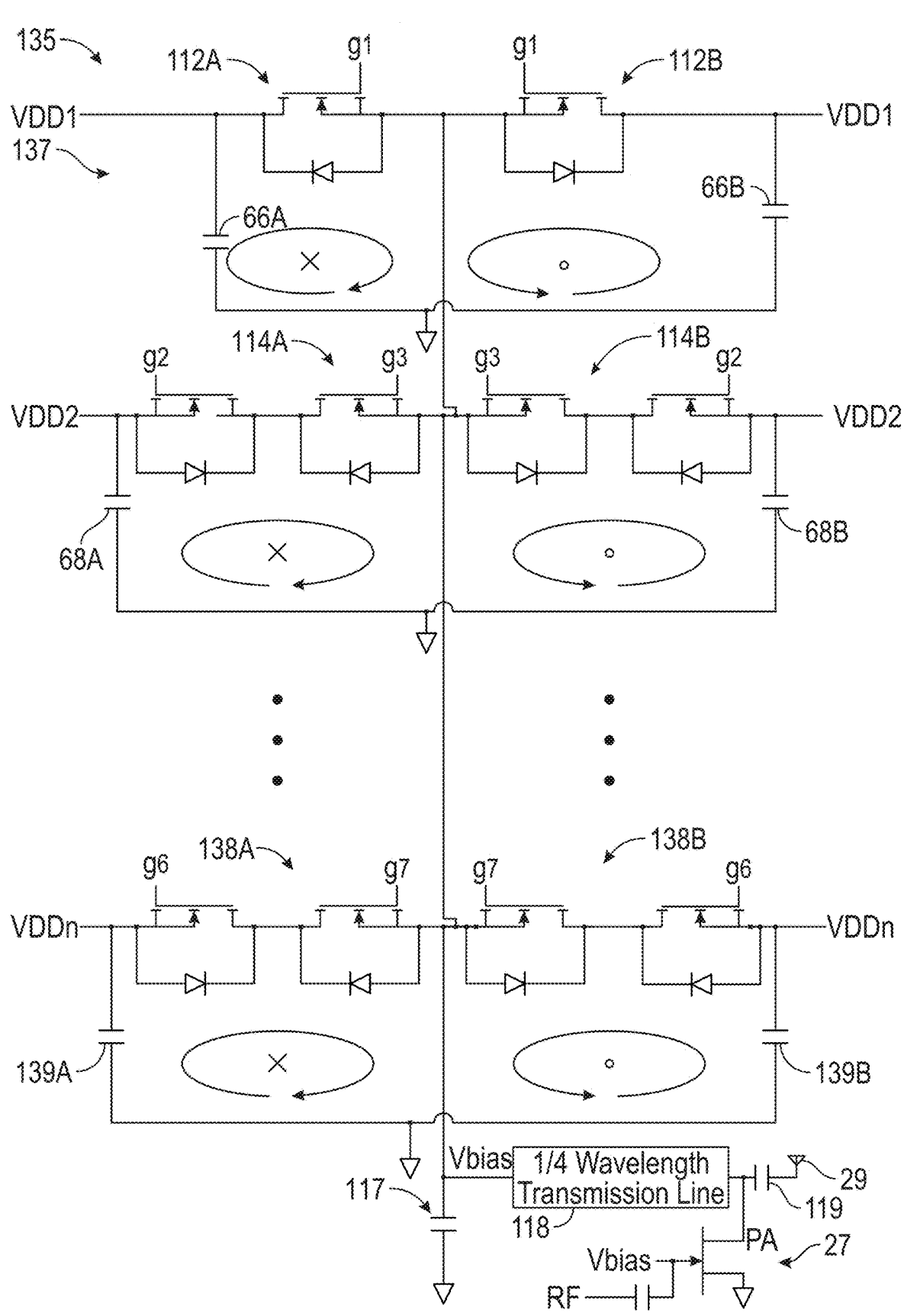
FIG. 13B is a schematic diagram of a radio frequency system that includes a multi-input, single output bias voltage multiplexer that includes MOSFET switches according to an embodiment.

FIG. 13B is a schematic diagram of a radio frequency system 135 that includes a multi-input, single output bias voltage multiplexer 137 that includes MOSFET switches according to an embodiment. The voltage multiplexer 137 includes a first pair of MOSFET switches 112A and 112B and a second pair of MOSFET switches 124A and 124B. The voltage multiplexer 137 also includes one or more additional pairs of MOSFET switches with magnetic field cancellation and configured to receive one or more additional bias voltages. The one or more additional pairs of MOSFET switches includes MOSFET switches 138A and 138B, which are configured to receive additional bias voltage VDDn. The MOSFET switches 138A, 138B are each connected to a respective bypass capacitor 139A, 139B. Any suitable number of additional pairs of switches and additional bias voltages can be implemented for a particular application.

Although certain embodiments relate to symbol based envelope trackers, any suitable principles and advantages disclosed herein can be applied to envelope trackers that continuously track an envelope of an RF signal. An example envelope tracker with continuous envelope tracking will be discussed with reference to FIG. 14.

Figure 14:
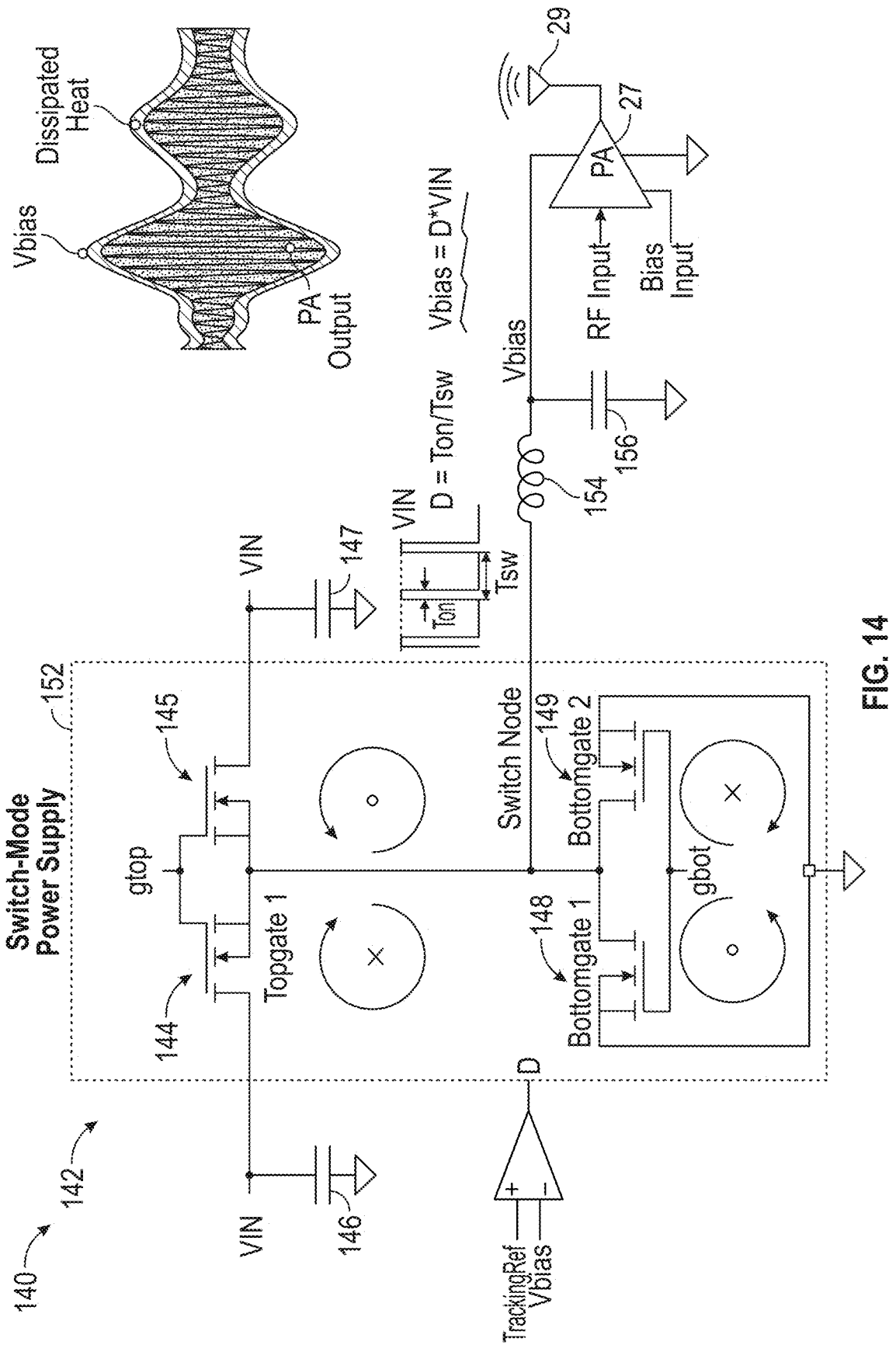
FIG. 14 is a schematic diagram of a radio frequency system that includes a switch-mode power supply voltage regulator circuit that continuously tracks an envelope with magnetic field cancellation according to an embodiment.

FIG. 14 is a schematic diagram of a radio frequency system 140 that includes a switch-mode power supply voltage regulator circuit 142 with magnetic field cancellation according to an embodiment. The envelope tracker of FIG. 14 includes opposite and opposing switches 144, 145 and bypass capacitors 146, 147. Opposite and opposing top gate switches 144, 145 and opposite and opposing bottom gate switches 148, 149 are included in a switch-mode supply circuit 152. The switch-mode power supply voltage regulator circuit 142 generates a bias voltage Vbias that continuously tracks an envelope of an RF signal (e.g., RF input). The switch-mode power supply voltage regulator circuit 142 is an example voltage modulator for continuous envelope tracking.

The switch-mode power supply voltage regulator circuit 142 includes the switch-mode supply circuit 152 and an inductor 154. The switch-mode supply circuit 152 can provide a voltage pulse with a duty factor that is set by the on time of the switches 144, 145 during a switching cycle. The inductor 154 and load capacitance 156 can generate a bias voltage signal Vbias that is proportional to the duty factor of the voltage pulse times the input supply voltage. The switches 144, 145 can be controlled such that the bias voltage Vias tracks the envelope of the RF signal RF Input.

In FIG. 14, the output bias voltage Vbias of the switch-mode power supply voltage regulator circuit 142 can continuously vary the bias voltage Vbias to track the PA RF waveform. In this embodiment, the opposite and opposing switches 144, 145 and bypass capacitors 146, 147 reduce parasitic inductance in the inductor switch node loop. This can allow for faster switch node transition times. Faster switch node transition times can allow for one or more of faster switching frequency, reduced minimum on time of the top gate switches 144, 145 and the bottom gate switches 148, 149, reduced electromagnetic interference (EMI), and increased closed loop bandwidth when negative feedback is used to control the output.

CONCLUSION

In the embodiments described above, apparatus, systems, and methods for power amplifiers envelope trackers are described in connection with particular embodiments. It will be understood, however, that the principles and advantages of the embodiments can be used for any other systems, apparatus, or methods with a need for envelope tracking programmable power amplifier. Moreover, any suitable principles and advantages disclosed herein can be implemented in systems and in methods that include a power amplifier transmitting a radio frequency signal via one or more antennas.

The principles and advantages described herein can be implemented in various apparatuses. Examples of such apparatuses can include, but are not limited to, communications infrastructure such as wireless communications infrastructure, consumer electronic products, parts of the consumer electronic products, electronic test equipment, vehicular electronic products, industrial electronic products, etc. Electronic products can include, but are not limited to, base stations such as cellular base stations, access points, repeaters, relays, wireless communication devices, a mobile phone (for example, a smart phone), a hand-held computer, a tablet computer, a laptop computer, a wearable computing device, a vehicular electronics system, a radio, a wearable health monitoring device, an Internet of Things (IoT) device, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all the following interpretations of the word: any of the items in the list, all the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only and are not intended to limit the scope of the disclosure. Indeed, the novel methods and systems described herein may be embodied in a variety of other forms. Furthermore, various omissions, substitutions, and changes in the form of the methods and systems described herein may be made without departing from the spirit of the disclosure. For example, while the disclosed embodiments are presented in given arrangements, alternative embodiments may perform similar functionalities with different components and/or circuit topologies, and some elements may be deleted, moved, added, subdivided, combined, and/or modified. Each of these elements may be implemented in a variety of different ways as suitable. Any suitable combination of the elements and acts of the various embodiments described above can be combined to provide further embodiments. The accompanying claims and their equivalents are intended to cover such forms or modifications as would fall within the scope and spirit of the disclosure. Accordingly, the scope of the present inventions is defined by reference to the claims.

What is claimed is:

1. A power amplifier system with magnetic field cancellation in envelope tracking, the power amplifier system comprising:

a voltage modulator circuit configured to generate a bias voltage that tracks an envelope of a radio frequency signal, the voltage modulator circuit comprising a first pair of switches with magnetic field cancellation, wherein the first pair of switches includes a first switch and a second switch, the first switch is in a first current loop that also includes a first bypass capacitor, the second switch is in a second current loop that also includes a second bypass capacitor, and the first current loop and the second current loop are configured to generate magnetic fields having opposite directions; and a power amplifier configured to receive the bias voltage and amplify the radio frequency signal.

2. The power amplifier system of claim 1, wherein the voltage modulator circuit comprises a second pair of switches with magnetic field cancellation, the first pair of switches is configured to receive a first supply voltage, and the second pair of switches is configured to receive a second supply voltage.

3. The power amplifier system of claim 2, wherein the bias voltage tracks the envelope of the radio frequency signal on a symbol-by-symbol basis.

4. The power amplifier system of claim 2, wherein the voltage modulator circuit is configured to adjust the bias voltage corresponding to symbol boundaries of the radio frequency signal.

5. The power amplifier system of claim 2, wherein the bias voltage tracks the envelope of the radio frequency signal for a group of symbols.

6. The power amplifier system of claim 2, wherein the voltage modulator circuit further comprises a capacitor coupled between a first input node configured to receive the first supply voltage and a second input node configured to receive the second supply voltage.

7. The power amplifier system of claim 2, wherein the voltage modulator circuit comprises a third pair of switches configured to receive a third supply voltage and a fourth pair of switches configured to receive a fourth supply voltage.

8. The power amplifier system of claim 2, wherein the second pair of switches includes field effect transistors.

9. The power amplifier system of claim 2, wherein a switch of the second pair of switches comprises back-to-back field effect transistors in a common-source configuration.

10. The power amplifier system of claim 2, wherein a switch of the second pair of switches comprises back-to-back field effect transistors in a common-drain configuration.

11. The power amplifier system of claim 1, further comprising an antenna and a quarter-wavelength transmission line, the quarter-wavelength transmission line coupled between the power amplifier and an output of the voltage modulator circuit.

12. A voltage multiplexer with magnetic field cancellation, the voltage multiplexer comprising:

a first pair of switches configured to receive a first supply voltage, the first pair of switches comprising a first switch of a first current loop and a second switch of a second current loop, wherein the first current loop and the second current loop are configured to generate magnetic fields having opposite directions; and a second pair of switches configured to receive a second supply voltage, the second pair of switches comprising a third switch of a third current loop and a fourth switch of a fourth current loop, wherein the third current loop and the fourth current loop are configured to generate magnetic fields having opposite directions;

wherein the voltage multiplexer is configured to generate a bias voltage that tracks an envelope of a radio frequency signal provided to a power amplifier.

13. The voltage multiplexer of claim 12, wherein the bias voltage tracks the envelope of the radio frequency signal on a symbol-by-symbol basis.

14. The voltage multiplexer of claim 12, wherein the voltage multiplexer is configured to adjust the bias voltage corresponding to symbol boundaries of the radio frequency signal.

15. The voltage multiplexer of claim 12, further comprising one or more additional pairs of switches with magnetic field cancellation configured to receive one or more additional supply voltages.

16. The voltage multiplexer of claim 12, wherein the voltage multiplexer is configured to generate the bias voltage by controlling pairs of switches to selectively provide one of a plurality of supply voltages as the bias voltage, the pairs of switches comprising the first pair of switches and the second pair of switches, and the plurality of supply voltages comprising the first supply voltage and the second supply voltage.

17. A method of generating a bias voltage with magnetic field cancellation, the method comprising:

receiving a plurality of supply voltages; and controlling pairs of switches to selectively provide one of the plurality of supply voltages as a bias voltage, wherein the controlling adjusts the bias voltage at symbol boundaries of a radio frequency signal that is amplified by a power amplifier that receives the bias voltage, wherein each of the pairs of switches comprise a first switch of a first current loop and a second switch of a second current loop, and wherein the first current loop and the second current loop generate magnetic fields having opposite directions.

18. The method of claim 17, wherein the bias voltage tracks an envelope of the radio frequency signal on a symbol-by-symbol basis.

19. The method of claim 17, wherein the controlling comprises make-before-break switching.

20. The method of claim 17, wherein at least one of the pairs of switches comprises a switch that includes two series field effect transistors in a junction isolation configuration.

* * * * *